(12) United States Patent
Tian et al.

(10) Patent No.: US 7,228,889 B1
(45) Date of Patent: Jun. 12, 2007

(54) HEAT DISSIPATION DEVICE

(75) Inventors: Wei-Qiang Tian, Shenzhen (CN); Wan-Lin Xia, Shenzhen (CN); Tao Li, Shenzhen (CN)

(73) Assignees: Fu Zhun Precision Industry (Shen Zhen) Co., Ltd., Shenzhen, Guangdong Province (CN); FoxConn Technology Co., Ltd., Tu-Chen, Taipei Hsien (TW)

( * ) Notice: Subject to any disclaimer, the term of this patent is extended or adjusted under 35 U.S.C. 154(b) by 0 days.

(21) Appl. No.: 11/306,701

(22) Filed: Jan. 9, 2006

(51) Int. Cl.
*F28F 13/12* (2006.01)
*H05K 7/20* (2006.01)

(52) U.S. Cl. .................. 165/122; 165/80.3; 165/104.34

(58) Field of Classification Search ................ 165/121, 165/122, 80.3, 185, 104.21, 104.33, 104.34; 361/695, 697, 700; 275/715; 174/16.3, 174/15.2
See application file for complete search history.

(56) References Cited

U.S. PATENT DOCUMENTS

| | | | | |
|---|---|---|---|---|
| 5,077,601 A | * | 12/1991 | Hatada et al. ............... | 257/722 |
| 5,597,035 A | * | 1/1997 | Smith et al. ................ | 165/80.3 |
| 5,630,469 A | * | 5/1997 | Butterbaugh et al. ....... | 165/80.3 |
| 5,936,836 A | * | 8/1999 | Scholder ..................... | 361/695 |
| 5,963,424 A | * | 10/1999 | Hileman et al. ............. | 361/695 |
| 6,031,720 A | | 2/2000 | Crane, Jr. et al. | |
| 6,304,445 B1 | | 10/2001 | Bollesen | |
| 6,352,103 B1 | * | 3/2002 | Chu et al. ................... | 165/80.3 |
| 6,542,364 B2 | * | 4/2003 | Lai et al. ..................... | 361/697 |
| 6,779,595 B1 | * | 8/2004 | Chiang .................. | 165/104.33 |
| 6,781,834 B2 | * | 8/2004 | Nair et al. ................... | 361/697 |
| 6,967,845 B2 | * | 11/2005 | Chiang et al. ............. | 361/709 |
| 7,040,384 B2 | * | 5/2006 | Shiang-Chich .............. | 165/122 |

* cited by examiner

*Primary Examiner*—Tho Duong
(74) *Attorney, Agent, or Firm*—Winston Hsu

(57) ABSTRACT

A heat dissipation device includes a seat, a fin set arranged on the seat, a fan, a fan mounting device having the fan mounted thereto, and a cover covering the fin set. The fan has a portion thereof located above the fin set. An opening is defined in fan mounting device and communicates the fan with the fin set and the fan with a space above a top of the fin set. The cover has a rearwards expanding port for guiding an airflow generated by a system fan to flow through the fin set. A top wall of the cover has a void to expose a portion of the top of the fin set.

16 Claims, 5 Drawing Sheets

HEAT DISSIPATION DEVICE

FIELD OF THE INVENTION

The present invention relates generally to a heat dissipation device, and more particularly to a heat dissipation device incorporating with a fan for dissipating heat generated by an electronic device.

DESCRIPTION OF RELATED ART

It is well known that, during operation of a computer, electronic devices such as central processing units (CPUs) frequently generate large amounts of heat. The heat must be quickly removed from the electronic device to prevent it from becoming unstable or being damaged. Typically, a heat dissipation device is attached to an outer surface of the electronic device to absorb heat from the electronic device. The heat absorbed by the heat dissipation device is then dissipated to ambient air.

Generally, the heat dissipation device mainly comprises a heat conducting base and a plurality of heat dissipating fins extending from one face of the base. In use, the base has a face opposite the fins attached to the electronic device to absorb the heat generated by the electronic device; then, the heat reaches the fins to be dissipated to the ambient air.

With the development of computer industry, electronic devices of the computer have more and more powerful capacity. Consequently, more and more heat is produced by the electronic devices. The aforementioned heat dissipation device can no longer duly remove the heat from the electronic device; as a result, the heat accumulates in the electronic device and the heat dissipation device, which produces adverse impact to the function of the electronic device. For enhancing the heat dissipation efficiency of the heat dissipation device, a fan is typically desired to be combined thereto to provide a forced airflow to the fins of the heat dissipation device. However, the speedy upgrading trend in computer industry causes electronic devices to become more integrated and powerful, which results in more heat produced by the electronic devices. And more and more electronic devices need heat dissipation. Furthermore, a height of the computer is required to be smaller and smaller. Therefore, the heat dissipation device needs further improvement to meet the demand of heat dissipation of the electronic devices in the computer.

What is needed, therefore, is a heat dissipation device which has great heat dissipating capacity for heat generating electronic devices.

SUMMARY OF INVENTION

A heat dissipation device in accordance with a preferred embodiment of the present invention comprises a seat, a fin set arranged on the seat, a fan located at a front side the fin set, a fan mounting device having the fan mounted thereto, and a cover covering the fin set. The seat has a first face and a second face for contacting with a heat generating device. The fin set comprises a plurality of fins arranged on the first face of the seat, and a plurality of passages being defined between the fins. The fan has a portion thereof located above the fin set. The fan mounting device is located between the fin set and the fan, and comprises a hood hooding a front end of the fin set, and a faceplate having the fan mounted thereto. An opening is defined in the faceplate and communicates the fan with the fin set. The cover has an expanding port defined at a rear end of the fin set for guiding an airflow generated by a system fan to flow through the fin set.

Other advantages and novel features will become more apparent from the following detailed description of preferred embodiments when taken in conjunction with the accompanying drawings, in which:

DETAILED DESCRIPTION

Figure 1:
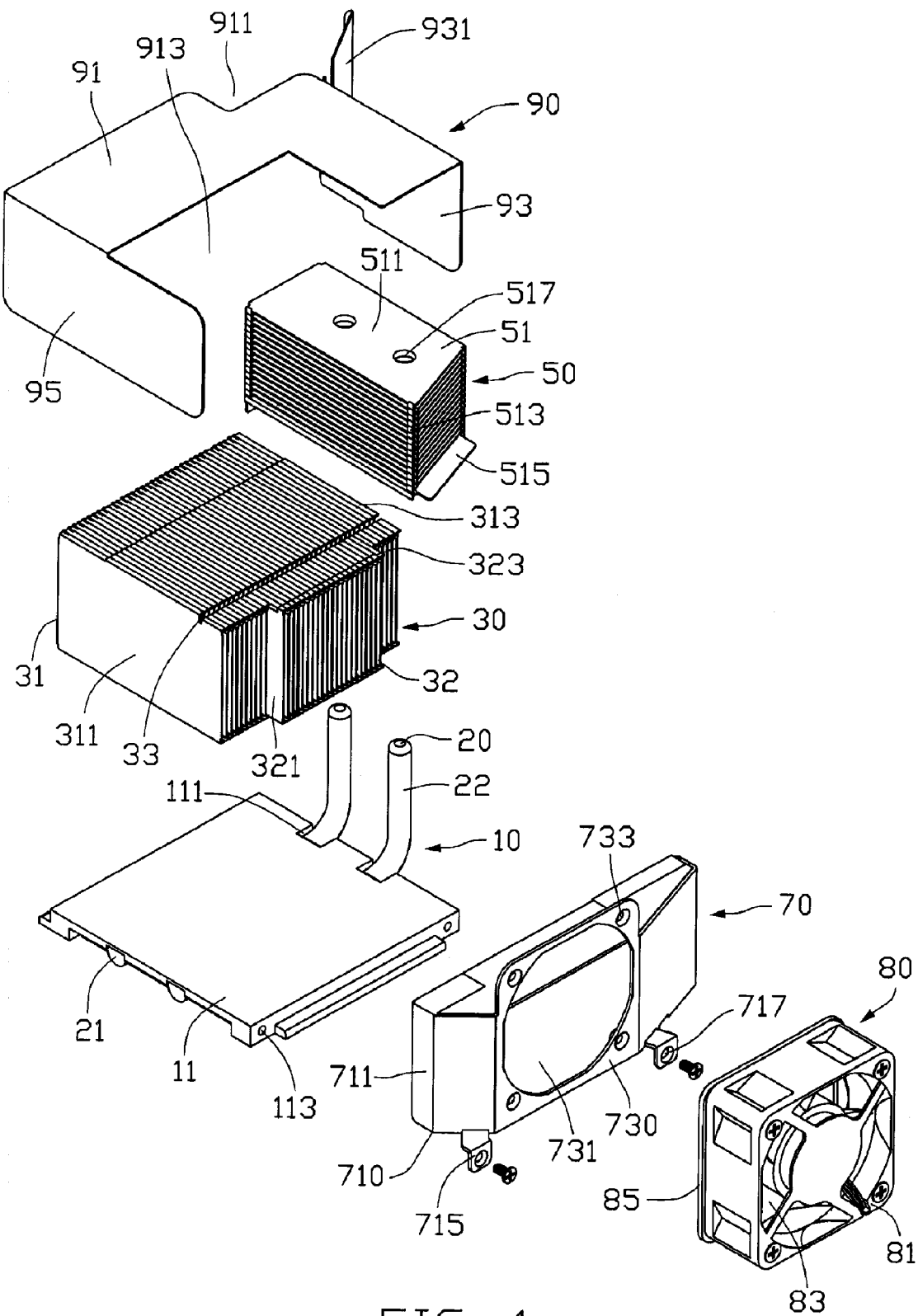
FIG. 1 is an exploded, isometric view of a heat dissipation device in accordance with a preferred embodiment of the present invention.

Referring to FIG. 1, a heat dissipation device in accordance with a preferred embodiment of the present invention is used for dissipating heat generated by electronic devices (not shown) in a computer enclosure (not show). The heat dissipation device comprises a heat conducting seat 10, a first fin set 30, a second fin set 50, a fan mounting device 70, a fan 80 for providing a forced airflow through the first and second fin sets 30,50, and a cover 90 for guiding the airflow to the first and second fin sets 30,50.

Figure 5:
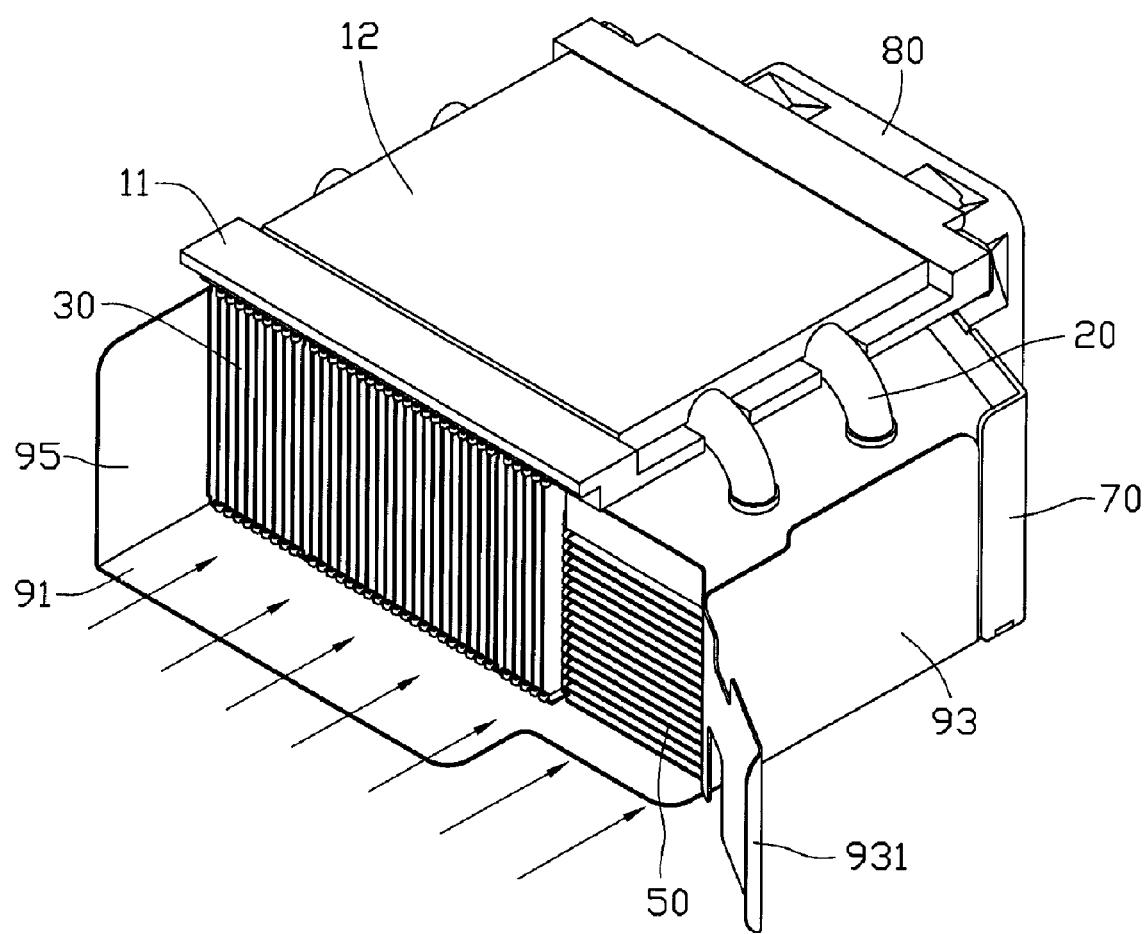
FIG. 5 is an assembled view of FIG. 1, from a bottom and rear aspect thereof.

Referring also to FIG. 5, the seat 10 comprises a first base plate 11 and a second base plate 12. The first base plate 11 has a bottom face defining a recess (not labeled) therein, and a top face for positioning the first and second fin sets 30,50 thereon. The second base plate 12 is embedded in the recess of the first base plate 11. The first and second base plates 11, 12 cooperatively define two channels (not labeled) therebetween. The first base plate 11 has an edge defining two cutouts 111 corresponding to the two channels respectively. Two fixing holes 113 are defined at a lateral side of the first base plate 11 for fixing the fan mounting device 70 thereto. Two L-shaped heat pipes 20 have first heat transferring sections (i.e., evaporating sections) 21 received in the two channels respectively, and second heat transferring sections (i.e., condensing sections) 22 projecting upwardly away from the seat 10 and through the two cutouts 111 respectively. A bottom face of the second base plate 12 is used for contacting with a major one of the heat generating electronic devices such as a central processing unit (CPU).

The first fin set 30 comprises a plurality of vertical first fins 31 and a plurality of vertical second fins 32 assembled together. Each of the first and second fins 31, 32 has a body 311, 321, and two flanges 313,323 extending from top and bottom edges of the body 311, 321. The first fins 31 are located at two lateral sides of the second fins 32 and are shorter than the second fins 32. The second fins 32 have a front end (not labeled) projecting forwardly beyond a front end of the first fins 31. The first fin set 30 has a depression 33 transversely extending in a top face thereof, near the front ends of the first and second fins 31, 32. A plurality of air passages (not labeled) is defined between the first fins 31 and the second fins 32.

The second fin set 50 comprises a plurality of horizontal fins 51 stacked together. Each of the fins 51 comprises a body 511 and four locking portions 513 formed at four corners of the body 511, respectively. The locking portions 513 lock up adjacent fins 51 together. A bottom one of the fins 51 has two flaps 515 extending outwardly. Two vertical through holes 517 are defined in the bodies 511 of the fins 51, for receiving the condensing sections 22 of the two heat pipes 20. A plurality of air passages (not labeled) is defined between the fins 51.

Figure 3:
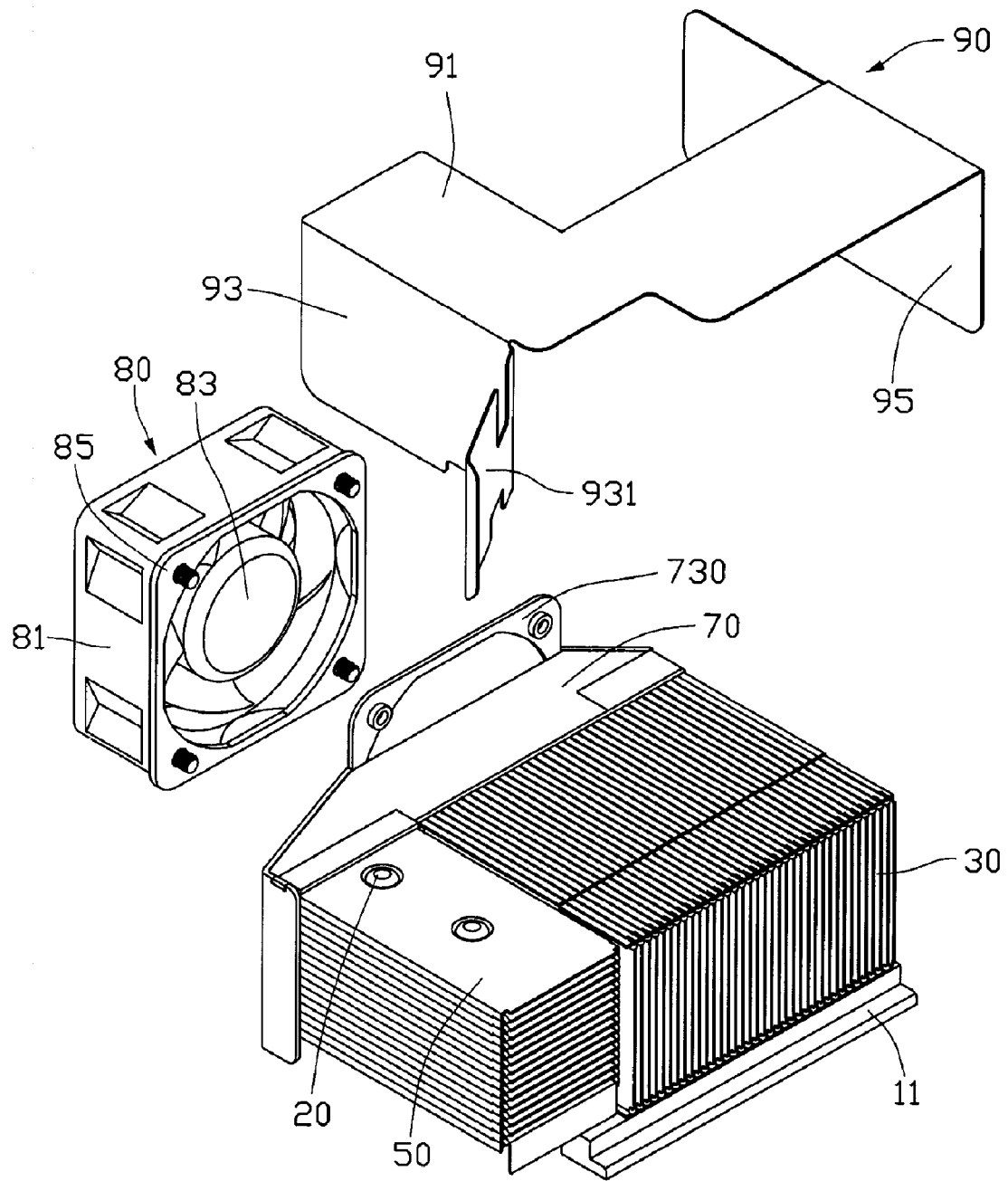
FIG. 3 is a partially assembled view FIG. 1, from a rear aspect thereof.

Referring also to FIG. 3, the first fin set 30 is positioned on the seat 10 with the bottom flanges 313, 323 thereof soldered to the top face of the first base plate 11 of the seat 10. The second fin set 50 is stacked on the two condensing sections 22 of the two heat pipes 20 with the two condensing sections 22 being soldered in the two through holes 517 of the second fin set 50.

Figure 2:
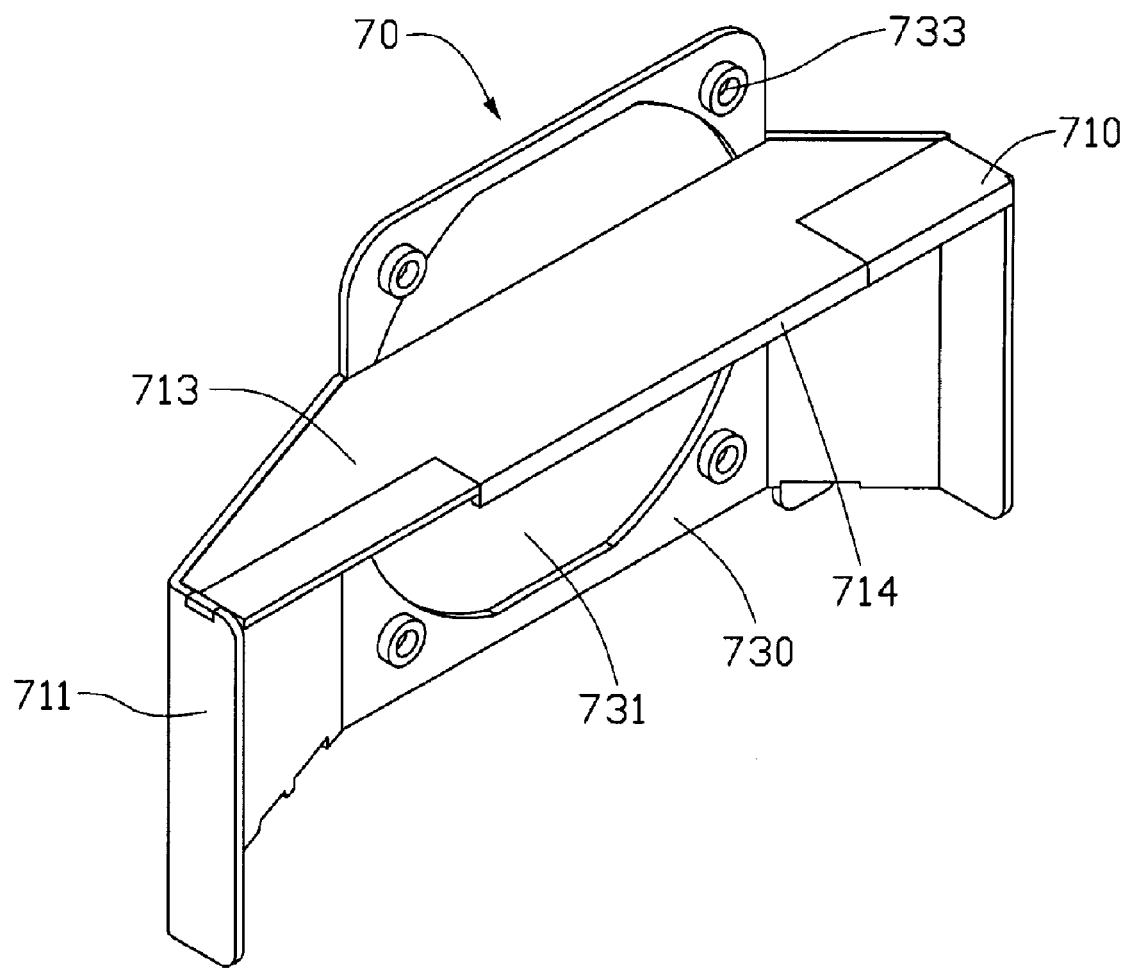
FIG. 2 shows a fan mounting device of FIG. 1, from a rear aspect thereof.

Referring also to FIGS. 1 and 2, the fan mounting device 70 is located in front of the first, second fin sets 30, 50. The mounting device 70 comprises a hood 710 for hooding front ends of the first, second fin sets 30, 50, and a faceplate 730 formed on the hood 710 for fixing the fan 70 thereto. The hood 710 includes three interconnected walls: two opposite lateral walls 711 and a top wall 713 interconnecting the two lateral walls 711. The two lateral walls 711 have corresponding portions (not labeled) slanting toward each other to connect with the faceplate 730; therefore, the hood 710 defines an increasingly expanded channel from the faceplate 730 rearwards towards the fin sets 30, 50. The top wall 713 forms a downwardly extending positioning rib 714 at a rear end thereof for fitting into the depression 33 of the first fin set 30. The faceplate 730 is substantially rectangular plate with an opening 731 defined in a center thereof. The faceplate 730 and the opening 731 each have an upper portion located above the top wall 713 of the hood 710. Four fixing holes 733 are respectively defined at four corners of the faceplate 730 for fixing the fan 90 thereto. From bottoms of the slantwise portions of the lateral walls 711 of the hood 710, two fixing tabs 715 (FIG. 1) each with a fixing hole 717 defined therein extend downwardly. The fixing holes 717 are correspondent to the fixing holes 113 of the first base plate 11 of the seat 10.

Referring back to FIG. 1, the fan 80 has a square configuration, and comprises a fan bracket 81 and an impeller 83 mounted in the bracket 81. The bracket 81 has each corner thereof defining a through hole (not labeled) corresponding to the fixing hole 733 of the faceplate 730 of the mounting device 70. Four screws (not labeled) are used to extend through the through holes of the bracket 81 and screw into the fixing holes 733 to secure to the fan 80 to the fan mounting device 70.

The heat dissipation device further comprises a cover 90 for covering the first and second fin sets 30, 50. The cover 90 comprises a ceiling 91 and first and second sidewalls 93, 95 depending from two opposite sides of the ceiling 91, respectively. The ceiling 91 is substantially L-shaped from a top aspect thereof. The ceiling 91 has an indentation 911 defined at a rear corner thereof adjacent the first sidewall 93. A large void 913 is defined in a front side of the ceiling 91 near the second sidewall 95. The first sidewall 93 has a flared-out guiding plate 931 at a rear end thereof.

Figure 4:
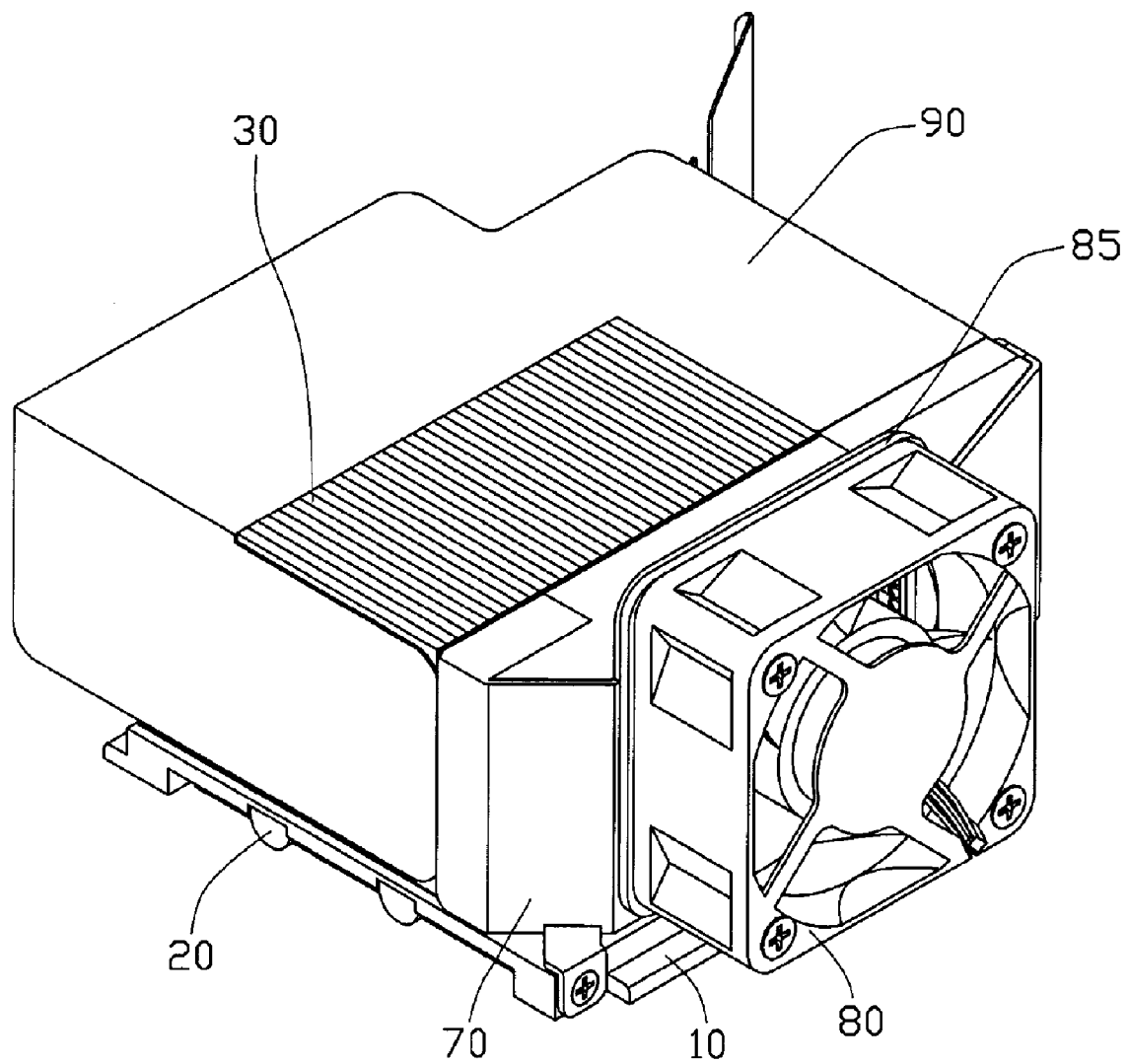
FIG. 4 is an assembled view FIG. 1.

Referring also to FIGS. 3 and 4, the fan mounting device 70 has the hood 710 thereof hooding the front ends of the first and second fin sets 30, 50. The rib 714 of the top wall 713 of the hood 710 is positioned in the depressions 33 of the first fin set 30. The fan mounting device 70 is mounted to the seat 10 via two screws (not labeled) extending through the fixing holes 717 of the fixing tabs 715 of the fan mounting device 70 and screwing in the fixing holes 113 of the first base plate 11 of the seat 10.

The fan 80 is mounted to the fan mounting device 70 via the four screws engaging in the fixing holes 733 of the faceplate 730 of the fan mounting device 70. When mounted, the fan 80 alignedly faces the front end of the second fins 32 of the first fin set 30, and has an upper portion thereof located above the top of the first fin set 30. The opening 731 of the fan mounting device 70 communicates the fan 80 with the first fin set 30, and the upper portion of the opening 731 is located above the top of the first fin set 30 (best seen in FIG. 3).

Moreover, an elastic pad 85 is sandwiched between the fan 80 and the faceplate 730 of the fan mounting device 70. A configuration of the pad 85 is substantially similar to that of the faceplate 730. The elastic pad 85 is used to achieve a tight connection between the fan 80 and the fan mounting device 70 and to reduce a noise made by operation of the fan 80.

The cover 90 covers on the first and second fin sets 30, 50, wherein the ceiling 91 rests on tops of the first and second fin sets 30, 50. A portion of the top of the first fin set 30 is exposed to ambient air via the void 913 of the cover 90. Front edges of the ceiling 91, the first and second sidewalls 93, 95 abut rear edges of the top and lateral walls 713, 711 of the hood 710 of the fan mounting device 70. The first and second sidewalls 93, 95 are positioned at lateral sides of the second fin set 50 and the first fin set 30, respectively. Rear ends of the ceiling 91, first sidewall 93 and second sidewall 95 are located behind rear ends of the first and second fin sets 30, 50, and cooperate with the guiding plate 931 to define a rearwards expanding port (not labeled) at the rear end of the first and second fin sets 30, 50 for guiding an airflow generated by a computer system fan to flow through the first and second fin sets 30, 50.

In the present invention, at least a computer system fan (not shown) is located in the expanding port of the heat dissipation device for providing a forced airflow (as shown by arrows in FIG. 5) to flow through the first and second fin sets 30, 50 through an guidance of the guiding plate 931.

In use, the bottom face of the second base plate 12 contacts the CPU to absorb heat from the CPU. The heat in the second base plate 12 has a portion transferred to the second fin set 50 through the heat pipes 20, and another portion transferred to the first fin set 30 via the first base plate 11. The computer system fan at the expanding port of the heat dissipation device blows the airflow to the first and second fin sets 30, 50. The fan 80 facing the first fin set 30 generates an airflow drawing the heat from the first and second fin sets 30, 50. Under the action of the fan 80, the computer system fan, and the guidance of the cover 90 and fan mounting device 70, cooling air enters the expanding port to flow through the first and second fin sets 30, 50. The heat in the fins 31, 32, 51 is taken away by the cooling air.

According to the preferred embodiment of the present invention, the heat dissipation device has the fan 80, the fan mounting device 70 and the cover 90 cooperating with each other to guide a strong forced cooling airflow through the first and second fin sets 30, 50 to remove the heat in the fins 31, 32, 51, which is absorbed from the CPU effectively.

The heat dissipation device has two fin set 30, 50 to dissipate heat generated by the electronic device; thus, the heat dissipation device has large heat dissipating area to dissipate heat from the electronic device.

Additionally, the elastic pad 85 is sandwiched between the fan 80 and the fan mounting device 70, which effectively reduces vibration and thus noise resulting from the operation of the fan 80.

Furthermore, the fan 80 has the upper portion thereof located above the top of the first fin set 30; therefore, when the fan 80 works, the forced airflow produced by the fan 80 can flow through not only the passages in the first and second fin sets 30, 50, but also a space above the top of the first fin set 30, thereby cooling a second electronic component located on the top of the first fin set 30, which in the preferred embodiment is a hard disc (not shown) of the computer. Furthermore, since the top of the first fin set 30 has an exposed portion through the void 913 of the ceiling 91, the airflow flowing in the passages of the first fin set 30 can move upwardly through the void 913 to cool the hard disc.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a fin set comprising a plurality of fins, a plurality of passages being defined between the fins;
   a fan being located at a front side of the fin set, and having a portion thereof located above a top of the fin set;
   a fan mounting device located between the fin set and the fan, the fan mounting device comprising a hood hooding on a front end of the fin set, and a faceplate having the fan mounted thereto, an opening communicating the fan with the passages being defined in the faceplate, the opening having an upper portion located above the top of the fin set, whereby an airflow generated by the fan flows through not only the passages of the fins but also a space above the top of the fin set; and
   a seat;
   wherein the hood of the fan mounting device comprises a top wall and two opposite lateral walls having rear portions thereof parallel to each other and front portions thereof slanting toward each other to connect with the faceplate, whereby the hood defines an increasingly enlarged channel from the fan toward the fin set;
   wherein the seat has a first base plate, the fin set thermally connected to the first base plate; and
   wherein the seat further comprises a second base plate having a face for contacting with a heat generating device for absorbing heat therefrom, and wherein a heat pipe has an evaporating portion thereof sandwiched between the first and second base plates.

2. The heat dissipation device of claim 1 further comprising an elastic pad sandwiched between the faceplate of the fan mounting device and the fan, whereby a noise generated by operation of the fan can be reduced.

3. The heat dissipation device of claim 1, wherein the fin set defines a depression in the top thereof, and wherein the top wall of the hood of the fan mounting device extends a positioning rib engaged in the depression defined in the fin set.

4. The heat dissipation device of claim 1, wherein the heat pipe has a condensing portion thereof extending remotely from the seat, and wherein a second fin set comprises a plurality of fins stacked on the condensing portion of the heat pipe.

5. The heat dissipation device of claim 4 further comprising a cover covering on the fin sets, wherein the cover has an expanding port formed near a rear end of the fin sets.

6. The heat dissipation device of claim 5, wherein the cover comprises a ceiling covering on the two fin sets, first and second sidewalls positioned at outer lateral sides of the two fin sets, and wherein the first sidewall at the expanding port of the cover has a flared-out guiding plate adapted for guiding an airflow generated by a system fan to flow through at least the second fin set.

7. The heat dissipation device of claim 5, wherein the ceiling of the cover has a void over the first fin set, thereby exposing the fin set to ambient air.

8. A heat dissipation device comprising:
   a seat having a first face and a second face for contacting with a heat generating device;
   a fin set comprising a plurality of fins arranged on the first face of the seat, a plurality of passages being defined between the fins;
   a fan located at a front side of the fin set, and having a portion thereof located above the fin set;
   a fan mounting device located between the fin set and the fan, the fan mounting device comprising a hood hooding a front end of the fin set, and a faceplate having the fan mounted thereto, an opening communicating the fan with the passages of the fin set being defined in the faceplate; and
   a cover covering the fin set, having a rearwards expanding port defined at a rear end of the fin set;
   wherein the fan has a portion extending beyond the hood of the fan mounting device, whereby an airflow generated by the fan flows through not only the passages of the fin set but also a space outside the hood of the fan mounting device.

9. The heat dissipation device of claim 8, wherein the hood has an increasingly enlarged channel from the fan towards the fin set.

10. The heat dissipation device of claim 9, wherein the opening also communicates a space above a top of the fin set with the fan.

11. The heat dissipation device of claim 9 further comprising a second fin set beside the fin set.

12. The heat dissipation device of claim 11 further comprising a heat pipe, wherein the seat comprises a first base plate having the fin set arranged thereon, and a second base plate embed in a recess of the first base plate, and wherein the heat pipe has an evaporating portion sandwiched between the first and second base plates, and a condensing portion extending remotely from the seat and having the second fin set stacked thereon.

13. The heat dissipation device of claim 11, wherein the cover comprises a ceiling covering on the two fin sets, and first and second sidewalls positioned at outer lateral sides of the two fin sets, and wherein the ceiling has a void on a portion of the top of the fin set, thereby exposing the portion of the top of the fin set to ambient air, and wherein the first sidewall has a flared-out guiding plate extending from the second fin set to define the expanding port of the cover.

14. A heat dissipation device comprising:
   a first fin set having a bottom adapted for thermally connecting with a first heat-generating electronic device and a top adapted for receiving a second heat-generating electronic device thereon;
   a second fin set located beside the first fin set;
   a heat pipe having an evaporating section thermally connected with the bottom of the first fin set and a condensing section thermally connecting with second fin set;
   a cover covering the first and second fin sets with a portion of the top of the first fin set being exposed, the cover having a front end and a rear end, the rear end being flared and adapted for guiding an airflow generated by a system fan to flow through at least the second fin set;
a fan mounted to face a front end of the first fin set; and
a fan mounting device located between the fan and the first and second fin sets, the mounting device defines an increasingly enlarged channel from the fan to the first and second fins sets.

15. The heat dissipation device of claim 14, wherein the fan has a portion located above the top of the first fin set so that a portion of an airflow generated by the fan flows through a space of above the top of the first fin set.

16. The heat dissipation device of claim 14, wherein the second fin set has a plurality of horizontal fins stacked together.

* * * * *